United States Patent
Jin et al.

(10) Patent No.: US 10,468,635 B2
(45) Date of Patent: Nov. 5, 2019

(54) ORGANIC LIGHT-EMITTING DEVICE HAVING HIGH CONTRAST RATIO

(71) Applicant: Wuhan China Star Optoelectronics Semiconductor Display Technology Co., Ltd., Wuhan, Hubei (CN)

(72) Inventors: Xiang Jin, Hubei (CN); Chaoyu Yuan, Hubei (CN)

(73) Assignee: WUHAN CHINA STAR OPTOELECTRONICS SEMICONDUCTOR DISPLAY TECHNOLOGY CO., LTD., Wuhan, Hubei (CN)

( * ) Notice: Subject to any disclaimer, the term of this patent is extended or adjusted under 35 U.S.C. 154(b) by 0 days.

(21) Appl. No.: 15/764,792

(22) PCT Filed: Feb. 12, 2018

(86) PCT No.: PCT/CN2018/076434
§ 371 (c)(1),
(2) Date: Mar. 29, 2018

(87) PCT Pub. No.: WO2019/148548
PCT Pub. Date: Aug. 8, 2019

(65) Prior Publication Data
US 2019/0237706 A1 Aug. 1, 2019

(30) Foreign Application Priority Data
Jan. 31, 2018 (CN) .......................... 2018 1 0096298

(51) Int. Cl.
*H01L 51/52* (2006.01)
*H01L 27/32* (2006.01)
(Continued)

(52) U.S. Cl.
CPC ........ *H01L 51/5281* (2013.01); *H01L 27/322* (2013.01); *H01L 27/3246* (2013.01);
(Continued)

(58) Field of Classification Search
CPC ............. H01L 51/0545; H01L 51/0036; H01L 51/0541; H01L 51/5012; H01L 25/0753;
(Continued)

(56) References Cited

U.S. PATENT DOCUMENTS

2009/0184636 A1* 7/2009 Cok .................... H01L 51/5234
313/505

* cited by examiner

*Primary Examiner* — Thinh T Nguyen
(74) *Attorney, Agent, or Firm* — Leong C. Lei

(57) ABSTRACT

A high contrast ratio organic light-emitting display device includes a first and a second substrate disposed oppositely, a blue light-emitting layer disposed at an inner side of the first substrate, a color conversion layer disposed at an inner side of the second substrate and multiple spacer plates disposed between the first substrate and the second substrate. Wherein the color conversion layer includes multiple sub-conversion units which are arranged as a matrix, disposed separately and capable of correspondingly generating different lights. The spacer plate blocks adjacent two sub-conversion units. The present invention utilizes the spacer plate to block interference of the blue light at sub-conversion units to increase the contrast ratio of the display device. Besides, making the spacer plate to be reflective, the blue light emitted to each sub-conversion unit is more concentrated in order to increase the contrast ratio of different sub-conversion units.

20 Claims, 2 Drawing Sheets

(51) Int. Cl.
  *H01L 51/05* (2006.01)
  *H01L 25/075* (2006.01)
(52) U.S. Cl.
  CPC ...... *H01L 27/3283* (2013.01); *H01L 51/5271* (2013.01); *H01L 25/0756* (2013.01); *H01L 51/0545* (2013.01)
(58) Field of Classification Search
  CPC .. H01L 33/0504; H01L 33/32; H01L 25/0756
  USPC .............. 257/40, 72, 89; 438/22, 89, 82, 99
  See application file for complete search history.

ORGANIC LIGHT-EMITTING DEVICE HAVING HIGH CONTRAST RATIO

RELATED APPLICATIONS

The present application is a National Phase of International Application Number PCT/CN2018/076434, filed Feb. 12, 2018, and claims the priority of China Application No. 201810096298.9, filed Jan. 31, 2018.

FIELD OF THE INVENTION

The present invention relates to a display technology field, and more particularly to an organic light-emitting device having high contrast ratio.

BACKGROUND OF THE INVENTION

Along with the development of the display technology, an OLED (Organic Light-Emitting Diode) display panel has gradually become a mainstream. In the OLED product, a Micro-display has a unique advantage so that the Micro-display has a wider application than a general OLED product in the military aspect.

A blue OLED Micro-Display can realize a color display mainly through a combination of a blue light-emitting layer and a CCM (Color Changing Materials, color conversion material). Specifically, the blue light-emitting layer emits a blue light, and the blue light is converted by the CCM such that emitted lights can respectively display three different colors of R, G, and B in order to realize a color display. The operation principle of the CCM for converting the color of the light is: the blue light is a high energy light; when the blue light irradiates on the CCM material, the CCM material can emit a light having a smaller energy after absorbing the high energy light; through controlling the difference in the attenuation of the energy, a R (red) and a G (green) light are excited in order to realize a color conversion.

In a general structure, a gap is exited between the blue light-emitting layer and the CCM material. Besides, because of an affection of various factors, the gap between the blue light-emitting layer and the CCM material cannot be eliminated. Therefore, a light emitted from every point in the blue light-emitting layer will be transmitted to adjacent CCM material so that a light interference will be generated such that a contrast ratio of the display device is worse. Besides, when the gap is larger, the light interference is more serious. Conversion rates of the CCM material to B→R/B→G are different. When the light interference is stronger, the contrast ratio of the display device is worse; the color coordinate shift is larger correspondingly.

SUMMARY OF THE INVENTION

In view of the shortage of the conventional art, the present invention provides high contrast ratio organic light-emitting display device that can effectively block the interference of the light to increase the contrast ratio.

In order to achieve the above purpose, the present invention adopts following solution:

A high contrast ratio organic light-emitting display device, comprising: a first substrate and a second substrate disposed oppositely; a blue light-emitting layer disposed at an inner side of the first substrate; a color conversion layer disposed at an inner side of the second substrate; multiple spacer plates disposed between the first substrate and the second substrate; wherein the color conversion layer includes multiple sub-conversion units which are arranged as a matrix, disposed separately and capable of correspondingly generating a red light, a green light and a blue light after being excited by a blue light; light colors of adjacent two sub-conversion units after being excited by a blue light are different; and the spacer plate is blocked between adjacent two sub-conversion unit in order to block a blue light emits to one sub-conversion unit from entering to the other adjacent sub-conversion unit.

As for one embodiment, one terminal of the spacer plate is extended to be abutted to the inner surface of the second substrate.

As for one embodiment, the other terminal of the spacer plate abuts the blue light-emitting layer.

As for one embodiment, the spacer plate is perpendicular to the second substrate.

Or, the blue light-emitting layer includes multiple brick-shaped sub light-emitting units arranged as a matrix, each sub light-emitting unit is right opposite to one sub-conversion unit, one terminal of the spacer plate abuts the first substrate after passing through a space between two sub light-emitting units.

As for one embodiment, a surface of the spacer plate is a reflective surface.

Or, the spacer plate includes an upper portion and a lower portion disposed oppositely and separately, the upper portion is extended to a space between adjacent two sub-conversion units, and the lower portion abuts the blue light-emitting layer or the first substrate.

As for one embodiment, a surface of the lower portion of the spacer plate is a parabolic surface having a concave structure and a reflective function.

As for one embodiment, a focus of the surface of the lower portion is located on the blue light-emitting layer.

Or, the spacer plate includes a lower portion that abuts the blue light-emitting layer or the first substrate, and a surface of the lower portion of the spacer plate is a parabolic surface having a concave structure and a reflective function and a focus of the surface of the lower portion is located on the blue light-emitting layer.

The present invention utilizes the spacer plate disposed between two substrates of the organic light-emitting display device to block interference of the lights of the blue light at sub-conversion units having different colors excited by the blue light in order to increase the contrast ratio of the display device. Besides, making the spacer plate to be reflective and designing at a reasonable position such that the blue light emitted to each sub-conversion unit is more concentrated in order to increase the contrast ratio of different sub-conversion units.

DETAILED DESCRIPTION OF THE PREFERRED EMBODIMENT

In order to describe the purpose, the technology solution and the advantages of the present invention to be clearer, the following will combine the drawings and the embodiments to describe the present invention in detail. It can be understood that the specific embodiment described here is only used for explaining the present invention, not for limiting the present invention.

The OLED display device includes a first substrate and a second substrate disposed oppositely, a blue light-emitting layer disposed at an inner side of the first substrate, a color conversion layer disposed at an inner side of the second substrate and multiple spacer plates disposed between the first substrate and the second substrate. The color conversion layer includes multiple sub-conversion units that are arranged as a matrix, disposed separately and can correspondingly generate a red light, a green light and a blue light after being excited by a blue light. Light colors of adjacent two sub-conversion units after being excited by the blue light are different. The spacer plate blocks adjacent two sub-conversion units in order to block a blue light emitted to a sub-conversion unit enters an adjacent sub-conversion unit.

The spacer plate is made of a light-shielding material in order to block a light from passing through. Besides, a surface of the spacer plate can be designed as a reflective surface, and a blue light emitted from the blue light-emitting layer is blocked by the spacer plate and being reflected to enter to a corresponding sub-conversion unit in order to excite a color light corresponding to each sub-conversion unit. In one aspect, the light utilization rate is increased, in another aspect, a blue light interference phenomenon can be avoided in order to increase the contrast ratio of adjacent two sub-conversion unit, and the color display contrast ratio of the OLED display device.

Embodiment 1

Figure 1:
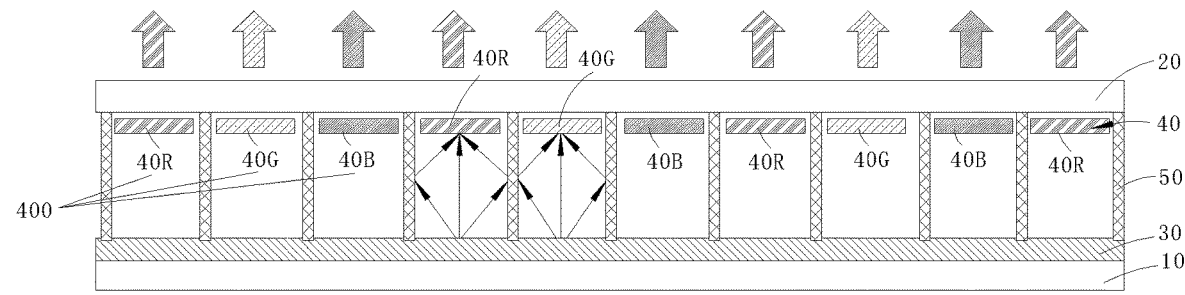
FIG. 1 is a schematic diagram of an OLED display device of a first embodiment of the present invention.

With reference to FIG. 1, an OLED display device of the present embodiment includes a first substrate 10 and a second substrate 20 disposed oppositely, a blue light-emitting layer 30 disposed at an inner side of the first substrate 10, a color conversion layer 40 disposed at an inner side of the second substrate 20 and multiple spacer plates 50 disposed between the first substrate 10 and the second substrate 20. A gap is existed between the blue light-emitting layer 30 and the color conversion layer 40. A blue light emitted from the blue light-emitting layer 30 enters the color conversion layer 40, and emitted out from the second substrate 20 after being excited to a corresponding color by the color conversion layer 40.

The color conversion layer 40 includes multiple sub-conversion units 400 arranged as a matrix. Every two adjacent sub-conversion units 400 are disposed separately, and light colors of adjacent two sub-conversion units 400 after being excited by a blue light are different. Each sub-pixel unit 400 corresponds to one sub-pixel. The sub-conversion units 400 include a red conversion unit 40R, a green conversion unit 40G and a blue conversion unit 40B. the three sub-conversion units 400 are arranged alternately, periodically and regularly such as a red conversion unit 40R, a green conversion unit 40G, a blue conversion unit 40B, a red conversion unit 40R, a green conversion unit 40G, a blue conversion unit 40B . . . , in a gap between every adjacent two sub-conversion units 400, the spacer plate 50 is provided. The multiple spacer plates 50 are vertically disposed between the first substrate 10 and the second substrate 20 simultaneously. Two terminals of each spacer plate 50 are respectively extended and abutted to the inner surface of the second substrate 20 and the inner surface of the blue light-emitting layer 30.

Though above arrangement, every four spacer plates 50, the blue light-emitting layer 30 and the second substrate 20 are surrounded as a closed cavity structure. Each sub-conversion unit 400 is located in one of the cavity structure such that a blue light emitted from the blue light-emitting layer between the spacer plates 50 can only emit to a sub-conversion unit 400 right opposite to it without emitting to the other sub-conversion units 400 by passing through the spacer plate 50. Accordingly, a light interference of lights excited by the blue light between adjacent sub-pixels can be avoided in order to ensure a display contrast ratio. Besides, when the surface of the spacer plate 50 is a reflective surface, the blue light emitted to each sub-conversion unit 400 is utilized after being gathered and converged in order to increase the light utilization rate.

It can be understood that the number of spacer plates 50 in each sub-conversion unit 400 is not limited to four, and can be another quantity. For example, all of the spacer plates 50 can be formed integrally, or multiple spacer plates 50 are formed integrally. The only requirement is to block a periphery of each sub-conversion unit 400.

Besides, when the surface of the spacer plate 50 is a reflective surface, the spacer plate 50 does not have to be completely perpendicular to the first substrate 10 and the second substrate 20. The first substrate 10 and the second substrate 20 do not have to be completely right opposite, and staggers with a certain of width. The only requirement is that the spacer plate 50, the blue light-emitting layer 30 and the second substrate 20 can surround as a closed cavity structure, and each sub-conversion unit 400 is located in one of the cavity structure. Each sub-conversion unit 400 and a portion of the blue light-emitting layer 30 are located in a same cavity structure. A portion of the blue light that cannot directly enter a corresponding sub-conversion unit 400 can be reflected and converged by surrounding spacer plate 50 to the sub-conversion unit 400 in the cavity structure in order to realize a similar effect. An appearance of this type of the OLED display device does not have to be a regular cube structure, and can be applied in a certain specific field.

Embodiment 2

Figure 2:
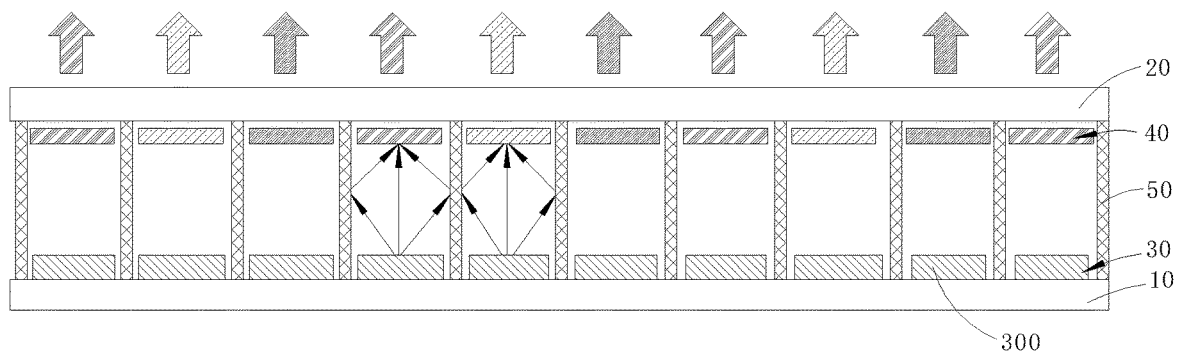
FIG. 2 is a schematic diagram of an OLED display device of a second embodiment of the present invention.

With reference to FIG. 2, the difference between the present embodiment and embodiment 1 is that the blue light-emitting layer 30 of present embodiment includes brick-shaped sub light-emitting unit 300 arranged as a matrix. A certain distance is existed between every two sub light-emitting units 300. Each sub light-emitting unit 300 is right opposite to one sub-conversion unit 400. One terminal of the spacer plate 50 abuts the second substrate 20, and the other terminal of the spacer plate 50 abuts the first substrate 10 after passing through a space between two sub light-emitting units 300.

In the present embodiment, every four spacer plates 50 respectively abut to the first substrate 10 and the second substrate 20 in order to be surrounded as a closed cavity structure. Each cavity structure has one sub-conversion unit 400 and one sub light-emitting unit 300. A portion of light emitted from the sub light-emitting unit 300 directly enters a sub-conversion unit 40 right opposite to the sub light-emitting unit 300, the other portion of light emitted from the sub light-emitting unit 300 converges to the sub-conversion unit 400 after being reflected by the spacer plate 50 several times.

Comparing to the embodiment 1, the spacer plate 50 of the OLED display device of the present embodiment does not directly contact with the blue light-emitting layer 30 so as to avoid damaging the blue light-emitting layer 30. The sub light-emitting unit 300 disposed independently corresponds to a corresponding sub-conversion unit 400, the light convergence effect is better so as to be beneficial to increase the contrast ratio of the display device. The spacer plate 50 is directly fixed on the surface of the first substrate 10 so that a manufacturing process of the OLED display device is simpler. Besides, the gap between the first substrate 10 and the second substrate 20 can be limited by the spacer plate 50 in order to omit the trouble to adjust the gap between the first substrate 10 and the second substrate 20.

Embodiment 3

Figure 3:
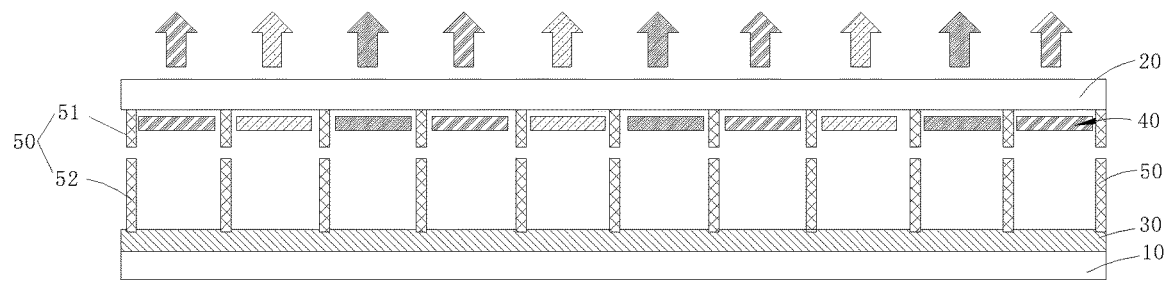
FIG. 3 is a schematic diagram of an OLED display device of a third embodiment of the present invention.

As shown in FIG. 3, comparing with embodiment 1 and embodiment 2, the structure of each spacer plate 50 of the present embodiment is slightly different.

Specifically, each spacer plate 50 includes an upper portion 51 and a lower portion 52 disposed oppositely and separately. A surface of each of the upper portion 51 and the lower portion 52 can be a reflective surface, or not a reflective surface only for blocking a light. The upper portion 51 is extended to a space between adjacent two sub-conversion units 400, and is fixed at an inner surface of the second substrate 20. A height of the upper portion 51 is greater than a thickness of the color conversion layer 40 such that a free end of the upper portion 51 is closer to the first substrate 10 comparing to the color conversion layer 40. Most of the light reflected by the lower portion 52 is blocked by the upper portion 51. The lower portion 52 abuts the blue light-emitting layer 30 or the first substrate 10, and is fixed on the blue light-emitting layer 30 or the first substrate 10. Using the structure of the spacer plate 50 by the above way, a gap between the first substrate 10 and the second substrate 20 can be adjusted according to an actual requirement. Most of the light emitted from the blue light-emitting layer 30 enters a corresponding sub-conversion unit 400 in order to avoid an interference of lights excited by the blue light between adjacent sub-pixels Embodiment 4

Figure 4:
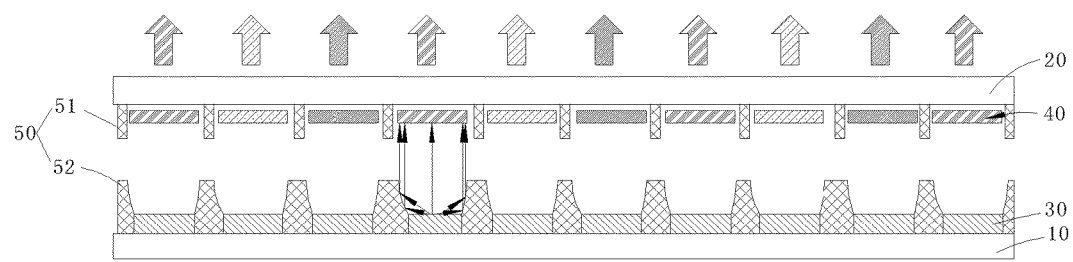
FIG. 4 is a schematic diagram of an OLED display device of a fourth embodiment of the present invention.

As shown in FIG. 4, the difference between the present embodiment and the above embodiments is: a surface of the lower portion 52 of the spacer plate 50 of the present embodiment is a parabolic surface having a concave structure and a reflective function. A focus of the surface of the lower portion 52 is located on the blue light-emitting layer 30 such that a blue light reflected by the parabolic surface vertically emits to a sub-conversion unit 400 in front of the parabolic surface in a basically parallel manner That is, most of the light emitted from the blue light-emitting layer 30 is perpendicular to the color conversion layer 40. Comparing to the embodiment 3, the spacer plate 50 of the present embodiment can omit the upper portion 51 and can avoid an interference of lights excited by the blue light between adjacent sub-pixels and increase the light utilization rate at the same time.

In summary, using the spacer plate disposed between two substrates of the organic light-emitting display device to block interference of the lights of the blue light at sub-conversion units having different colors excited by the blue light in order to increase the contrast ratio of the display device. Besides, making the spacer plate to be reflective and designing at a reasonable position such that the blue light emitted to each sub-conversion unit is more concentrated in order to increase the contrast ratio of different sub-conversion units.

The above embodiment does not constitute a limitation of the scope of protection of the present technology solution. Any modifications, equivalent replacements and improvements based on the spirit and principles of the above embodiments should also be included in the protection scope of the present technology solution.

What is claimed is:

1. A high contrast ratio organic light-emitting display device, comprising:
a first substrate and a second substrate disposed oppositely;
a blue light-emitting layer disposed at an inner side of the first substrate;
a color conversion layer disposed at an inner side of the second substrate;
multiple spacer plates disposed between the first substrate and the second substrate;
wherein the color conversion layer includes multiple sub-conversion units which are arranged as a matrix, disposed separately and capable of correspondingly generating a red light, a green light and a blue light after being excited by a blue light;
light colors of adjacent two sub-conversion units after being excited by a blue light are different; and
the spacer plate is blocked between adjacent two sub-conversion unit in order to block a blue light emits to one sub-conversion unit from entering to the other adjacent sub-conversion unit.

2. The high contrast ratio organic light-emitting display device according to claim 1, wherein a surface of the spacer plate is a reflective surface.

3. The high contrast ratio organic light-emitting display device according to claim 1, wherein the spacer plate includes an upper portion and a lower portion disposed oppositely and separately, the upper portion is extended to a space between adjacent two sub-conversion units, and the lower portion abuts the blue light-emitting layer or the first substrate.

4. The high contrast ratio organic light-emitting display device according to claim 3, wherein a surface of the lower portion of the spacer plate is a parabolic surface having a concave structure and a reflective function.

5. The high contrast ratio organic light-emitting display device according to claim 4, wherein a focus of the surface of the lower portion is located on the blue light-emitting layer.

6. The high contrast ratio organic light-emitting display device according to claim 1, wherein the spacer plate includes a lower portion that abuts the blue light-emitting layer or the first substrate, and a surface of the lower portion of the spacer plate is a parabolic surface having a concave structure and a reflective function and a focus of the surface of the lower portion is located on the blue light-emitting layer.

7. The high contrast ratio organic light-emitting display device according to claim 1, wherein one terminal of the spacer plate is extended to be abutted to the inner surface of the second substrate.

8. The high contrast ratio organic light-emitting display device according to claim 7, wherein the other terminal of the spacer plate abuts the blue light-emitting layer.

9. The high contrast ratio organic light-emitting display device according to claim 8, wherein a surface of the spacer plate is a reflective surface.

10. The high contrast ratio organic light-emitting display device according to claim 8, wherein the spacer plate includes an upper portion and a lower portion disposed oppositely and separately, the upper portion is extended to a space between adjacent two sub-conversion units, and the lower portion abuts the blue light-emitting layer or the first substrate.

11. The high contrast ratio organic light-emitting display device according to claim 10, wherein a surface of the lower portion of the spacer plate is a parabolic surface having a concave structure and a reflective function.

12. The high contrast ratio organic light-emitting display device according to claim 11, wherein a focus of the surface of the lower portion is located on the blue light-emitting layer.

13. The high contrast ratio organic light-emitting display device according to claim 8, wherein the spacer plate includes a lower portion that abuts the blue light-emitting layer or the first substrate, and a surface of the lower portion of the spacer plate is a parabolic surface having a concave structure and a reflective function and a focus of the surface of the lower portion is located on the blue light-emitting layer.

14. The high contrast ratio organic light-emitting display device according to claim 7, wherein the spacer plate is perpendicular to the second substrate.

15. The high contrast ratio organic light-emitting display device according to claim 7, wherein the blue light-emitting layer includes multiple brick-shaped sub light-emitting units arranged as a matrix, each sub light-emitting unit is right opposite to one sub-conversion unit, one terminal of the spacer plate abuts the first substrate after passing through a space between two sub light-emitting units.

16. The high contrast ratio organic light-emitting display device according to claim 15, wherein a surface of the spacer plate is a reflective surface.

17. The high contrast ratio organic light-emitting display device according to claim 15, wherein the spacer plate includes an upper portion and a lower portion disposed oppositely and separately, the upper portion is extended to a space between adjacent two sub-conversion units, and the lower portion abuts the blue light-emitting layer or the first substrate.

18. The high contrast ratio organic light-emitting display device according to claim 17, wherein a surface of the lower portion of the spacer plate is a parabolic surface having a concave structure and a reflective function.

19. The high contrast ratio organic light-emitting display device according to claim 18, wherein a focus of the surface of the lower portion is located on the blue light-emitting layer.

20. The high contrast ratio organic light-emitting display device according to claim 15, wherein the spacer plate includes a lower portion that abuts the blue light-emitting layer or the first substrate, and a surface of the lower portion of the spacer plate is a parabolic surface having a concave structure and a reflective function and a focus of the surface of the lower portion is located on the blue light-emitting layer.

* * * * *